(12) United States Patent
Mankyu

(10) Patent No.: US 9,917,337 B2
(45) Date of Patent: Mar. 13, 2018

(54) INSPECTION METHOD FOR FILM COVERED BATTERY

(71) Applicant: Automotive Energy Supply Corporation, Zama-shi, Kanagawa (JP)

(72) Inventor: Toshihiko Mankyu, Hachioji (JP)

(73) Assignee: AUTOMOTIVE ENERGY SUPPLY CORPORATION, Zama-shi (JP)

(*) Notice: Subject to any disclaimer, the term of this patent is extended or adjusted under 35 U.S.C. 154(b) by 231 days.

(21) Appl. No.: 14/778,378

(22) PCT Filed: Mar. 22, 2013

(86) PCT No.: PCT/JP2013/058265
§ 371 (c)(1),
(2) Date: Sep. 18, 2015

(87) PCT Pub. No.: WO2014/147808
PCT Pub. Date: Sep. 25, 2014

(65) Prior Publication Data
US 2016/0072157 A1    Mar. 10, 2016

(51) Int. Cl.
*H01M 10/48* (2006.01)
*H01M 10/42* (2006.01)
(Continued)

(52) U.S. Cl.
CPC ........ *H01M 10/48* (2013.01); *G01R 31/1263* (2013.01); *G01R 31/3627* (2013.01);
(Continued)

(58) Field of Classification Search
CPC ............... H01M 10/48; H01M 2/0287; H01M 10/4285; G01R 31/1263; G01R 31/3627
(Continued)

(56) References Cited

U.S. PATENT DOCUMENTS 4,904,946 A * 2/1990 Hirai ............... G01R 31/1263
                                                   324/551
5,523,137 A * 6/1996 Sei ..................... C09J 7/0242
                                                   257/E21.516
(Continued)

FOREIGN PATENT DOCUMENTS

CN        1697245 A       11/2005
EP      1 870 721 A1      12/2007
(Continued)

OTHER PUBLICATIONS

Chinese Office Action, dated Jan. 23, 2017, 12 pages.
Korean Office Action, dated Jul. 1, 2016, 5 pages.

*Primary Examiner* — Jeff Natalini
(74) *Attorney, Agent, or Firm* — Foley & Lardner LLP

(57) ABSTRACT

A film covered battery (1) has a flat shape with an outer cover member (5) formed of a laminate film to accommodate therein a battery element (4) together with an electrolytic solution. For reliable inspection of an insulation failure between a metal layer (52) of the laminate film and a negative electrode plate (42) of the battery element (4), an inspection test is performed on the film covered battery by a first inspection device (73) under a condition where pressure is applied to a center region of the outer cover member (5) by a first press bar (72); and an inspection test is performed on the film covered battery by a second inspection device (83) under a condition where pressure is applied to the remaining side regions of the outer cover member (5) by a second press bar (82).

4 Claims, 6 Drawing Sheets

(51) Int. Cl.
*G01R 31/12* (2006.01)
*G01R 31/36* (2006.01)
*H01M 10/052* (2010.01)
*H01M 2/02* (2006.01)

(52) U.S. Cl.
CPC ......... *H01M 2/0287* (2013.01); *H01M 10/42* (2013.01); *H01M 10/4285* (2013.01); *G01R 31/36* (2013.01); *H01M 2/0212* (2013.01); *H01M 2/0275* (2013.01); *H01M 10/052* (2013.01); *H01M 10/4214* (2013.01)

(58) Field of Classification Search
USPC ........................................................ 324/551
See application file for complete search history.

(56) References Cited

U.S. PATENT DOCUMENTS

| | | | |
|---|---|---|---|
| 7,008,720 B2 | 3/2006 | Shimamura et al. | |
| 7,336,081 B2 | 2/2008 | Kasamatsu et al. | |
| 8,035,394 B2 | 10/2011 | Takeno et al. | |
| 8,163,409 B2 | 4/2012 | Fujikawa et al. | |
| 8,168,314 B2 | 5/2012 | Fujikawa et al. | |
| 8,387,733 B2 | 3/2013 | Nakamura | |
| 2003/0193317 A1 | 10/2003 | Shimamura et al. | |
| 2005/0253591 A1 | 11/2005 | Kasamatsu et al. | |
| 2008/0008936 A1* | 1/2008 | Mizuta | H01G 9/08 429/185 |
| 2008/0143337 A1 | 6/2008 | Fujikawa et al. | |
| 2009/0261835 A1* | 10/2009 | Iwanaga | H01M 6/50 324/426 |
| 2009/0286148 A1 | 11/2009 | Fujikawa et al. | |
| 2010/0236854 A1 | 9/2010 | Nakamura | |
| 2012/0186071 A1 | 7/2012 | Yamashita et al. | |

FOREIGN PATENT DOCUMENTS

| | | |
|---|---|---|
| EP | 2 485 313 A1 | 8/2012 |
| JP | 2002-164557 A | 6/2002 |
| JP | 2003-303583 A | 10/2003 |
| JP | 2007-305426 A | 11/2007 |
| JP | 2008-218390 A | 9/2008 |
| JP | 2009-54300 A | 3/2009 |
| JP | 2009-156866 A | 7/2009 |
| JP | 2010-32346 A | 2/2010 |
| KR | 10-2012-0076349 A | 7/2012 |
| WO | WO 2011/040446 A1 | 4/2011 |

* cited by examiner

INSPECTION METHOD FOR FILM COVERED BATTERY

FIELD OF THE INVENTION

The present invention relates to a flat film covered battery having an outer cover member formed of a laminate film to accommodate therein a battery element and, more particularly, to a method for inspecting an insulation state between an electrode of the battery element and a metal layer of the laminate film.

BACKGROUND ART

A flat film covered battery is known, which includes an outer cover member formed of a metal-synthetic resin laminate film and a battery element having a plurality of positive electrode plates, negative electrode plates and separators alternately stacked together and accommodated together with an electrolytic solution in the outer cover member (see Patent Documents 1 and 2).

This type of film covered battery is configured as, for example, a lithium ion battery. Patent Document 2 discloses that, after the completion of the film covered battery as the lithium ion battery, the film covered battery is inspected for whether a metal terminal led out from between mating faces of the outer cover member is properly insulated from a metal layer of the outer cover member. In Patent Document 2, a first insulation failure inspection is performed with the application of an impulse voltage between the metal terminal and the metal layer of the outer cover member after placing the battery element in the outer cover member and heat-sealing peripheries of the laminate film of the outer cover member except the vicinity of the metal terminal (before filling the electrolytic solution); and a second insulation failure inspection is similarly performed with the application of an impulse voltage between the metal terminal and the metal layer of the outer cover member after filling the electrolytic solution into the outer cover member and completely sealing the outer cover member.

As a matter of course, the electrode of the battery element and the metal layer of the outer cover member have to be insulated from each other during use of the battery. It is thus preferable to inspect the occurrence of an insulation failure between the electrode of the battery element and the metal layer of the outer cover member under as close a condition as possible to the actual use of the battery. As mentioned above, the insulation failure inspection is performed after filling the electrolytic solution into the outer cover member and completely sealing the outer cover member in Patent Document 2. In this inspection, the film covered battery to be inspected is in a free state.

When a plurality of flat film covered batteries are stacked and used as a battery module, it is conceivable to exert some pressure on the film covered batteries in a direction perpendicular to main surfaces of the outer cover members (i.e. in a stacking direction of the positive electrode plates and the like) during use for the purpose of preventing displacement of the film covered batteries. Further, the film covered batteries may receive some pressure during transportation after completion or during battery module assembling. As the outer cover members are each formed of a laminate film and are thus flexible, there is a case that the internal battery elements may be pressurized in the stacking direction by deformation of the outer cover members under such external pressure.

Accordingly, it is not always possible to obtain adequate inspection reliability in the conventional insulation failure inspection where the film covered battery is inspected in the free state.

In view of the foregoing, it is an object of the present invention to provide a method for more reliable insulation failure inspection of a film covered battery.

PRIOR ART DOCUMENTS

Patent Document

Patent Document 1: Japanese Laid-Open Patent Publication No. 2003-303583
Patent Document 2: International Publication No. WO 2011/040446 A1

SUMMARY OF THE INVENTION

The present invention provides an inspection method for a film covered battery, the film covered battery being in flat form and comprising: a battery element having a positive electrode plate and a negative electrode plate stacked together via a separator; and an outer cover member formed of a laminate film and sealed to accommodate therein the battery element together with an electrolytic solution with a terminal of the battery element being led out from the outer cover member, the laminated film having a synthetic resin layer and a metal layer laminated on at least an inner surface of the synthetic resin layer, the inspection method comprising: performing an insulation failure inspection to inspect an insulation failure between the terminal and the metal layer under a pressurized condition where pressure is externally applied to the outer cover member in a stacking direction of the battery element.

There is a possibility that a very small foreign matter could get inside the outer cover member. In such a case, the insulation between the terminal and the metal layer is maintained when the film covered battery is in a free state. However, there may occur insulation failure between the terminal and the metal layer in a state that the laminate film is pressed against the battery element with the application of external pressure to the outer cover member as in the actual use of the battery. In the present invention, the insulation failure between the terminal and the metal layer is inspected under the pressurized condition where the pressure is externally applied to the outer cover member. It is thus possible to detect and reject any defective battery in advance with high reliability.

If the pressure is applied to the whole surface of the outer cover member at a time, the electrolytic solution densely filled in the outer cover member resists the pressure so as to interfere with contact of the outer cover member and the battery element. It is thus preferable in the present invention that: a surface of the outer cover member is divided into a plurality of regions when viewed in plan in the stacking direction; and the insulation failure inspection is performed on each of the divided regions under the pressurized condition where the pressure is applied to the each of the divided regions. In this case, the insulation failure inspection requires a plurality of inspection operations corresponding in number to the divided regions. It is however possible by applying the pressure to a part of the flexible outer cover member to assuredly press the outer cover member against the internal battery element and inspect the insulation failure under the condition close to the actual use of the battery.

When the insulation failure inspection is performed individually on the respective divided regions of the outer cover member as mentioned above, it is preferable that the sum of the divided regions to each of which the pressure is applied includes at least the whole area of the outer cover member covering the battery element such that the insulation failure inspection can be performed at least once on every part of the area of the outer cover member covering the battery element with the application of the pressure.

It is a preferred embodiment of the present invention that the inspection method for the film covered battery includes: transferring the film covered battery to a first inspection stage after filling the electrolytic solution and sealing the outer cover member; performing a first insulation failure inspection test between the terminal and the metal layer on the first inspection stage while operating a press bar of the first inspection stage to apply the pressure by a press surface of the press bar to one part of the area of the outer cover member covering the battery element; transferring the film covered battery to a second inspection stage; and performing a second insulation failure inspection test between the terminal and the metal layer on the second inspection stage while operating a press bar of the second inspection stage to apply the pressure by a press surface of the press bar to the other remaining part of the area of the outer cover member covering the battery element.

In other words, the area of the outer cover member covering the battery element is divided into two regions; and the insulation failure inspection is performed on these two regions by means of the first and second inspection stages, respectively. It is thus possible to reliably and efficiently inspect the insulation failure between the positive or negative electrode plate and the metal layer of the outer cover member all over the battery element.

In this way, the insulation failure inspection is performed under the pressurized condition where the film covered battery is externally pressurized after the filling of the electrolytic solution in the present invention. It is therefore possible to reliably detect and reject in advance such a defective film covered battery that can maintain insulation in the free state but causes the insulation failure in the state that the pressure is externally applied to the outer cover member.

DESCRIPTION OF EMBODIMENTS

Hereinafter, exemplary embodiments of the present invention will be described in detail below by way of the drawings.

Figure 1:
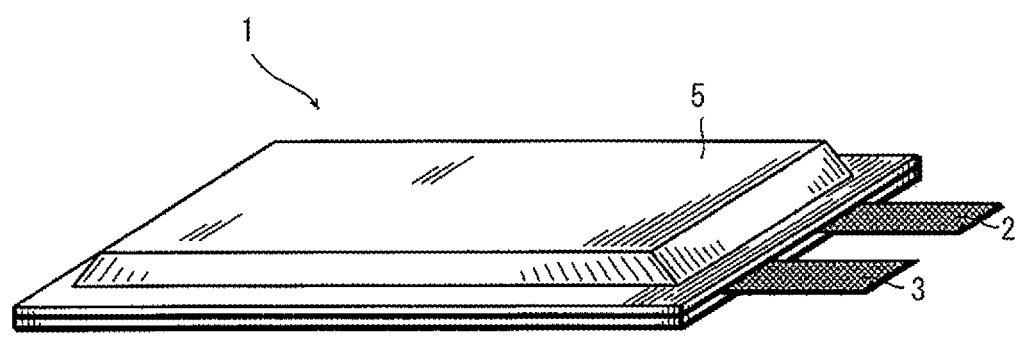
FIG. 1 is a perspective view of one example of a film covered battery to be inspected according to the present invention.

One example of a film covered battery 1 to be inspected according to the present invention will be first explained below with reference to FIGS. 1 and 2.

The film covered battery 1 is configured as, for example, a lithium ion secondary battery. As shown in FIG. 1, the film covered battery 1 has a flat rectangular appearance shape with a pair of terminals 2 and 3, each of which is formed of a conductive metal foil, extending from one longitudinal end side thereof.

Figure 2:
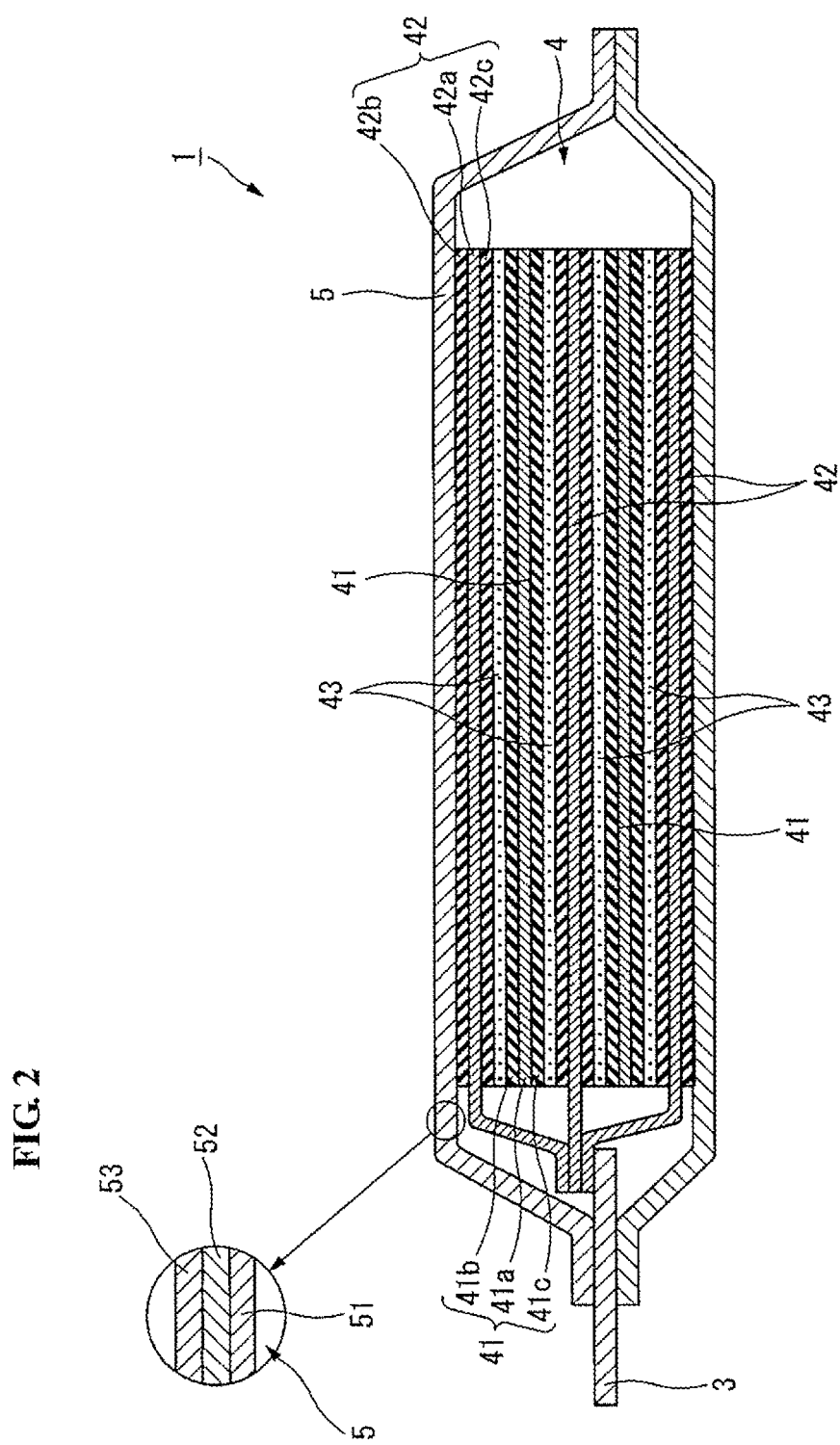
FIG. 2 is a section view of the film covered battery.

As shown in FIG. 2, the film covered battery 1 includes an outer cover member 5 formed of a laminate film and a rectangular battery element 4 accommodated together with an electrolytic solution in the outer cover member 5. The battery element 4 has a plurality of positive and negative electrode plates 41 and 42 alternately stacked together via separators 43. In the present example, the battery element 4 has three negative electrode plates 42, two positive electrode plates 41 and four separators 43 stacked between the negative and positive electrode plates 42 and 41, respectively. Namely, the negative electrode plates 42 are located at both outermost sides of the battery element 4 in the present example. The battery element 4 may alternatively be structured such that the positive electrode plates 41 are located as the outermost layers of the battery element 4. It is herein noted that, in FIG. 2, the dimensions of the respective structural components are not necessarily accurate and are exaggerated for illustration purposes.

Each of the positive electrode plates 41 has a rectangular positive electrode collector 41a and positive electrode active material layers 41b and 41c arranged on opposite main surfaces of the positive electrode collector 41a. The positive electrode collector 41a is formed of an electrochemically stable metal foil such as aluminum foil, aluminum alloy foil, copper foil or nickel foil. The positive electrode active material layers 41b and 41c are formed by mixing a lithium composite oxide such as lithium nickelate ($LiNiO_2$), lithium manganate ($LiMnO_2$) or lithium cobaltate ($LiCoO_2$) as a positive electrode active material with a conductive aid such as carbon black and a binder etc., applying the resulting composition to the respective main surfaces of the positive electrode collector 41a, and then, drying and rolling the applied composition.

Each of the negative electrode plates 42 has a rectangular negative electrode collector 42a and negative electrode active material layers 42b and 42c arranged on opposite main surfaces of the negative electrode collector 42a. The negative electrode collector 42a is formed of an electrochemically stable metal foil such as nickel foil, copper foil, stainless steel foil or iron foil. The negative electrode active material layers 42b and 42c are formed by mixing an amorphous carbon, hardly graphitizable carbon, easily graphitizable carbon or graphite as a negative electrode active material, which is capable of absorbing and desorbing the above positive electrode active material, with a binder etc., applying the resulting composition to the respective main surfaces of the negative electrode collector 42a, and then, drying and rolling the applied composition.

One longitudinal end portion of each of the negative electrode collector 42 is extended as an extension portion with no negative electrode active material layers 42b and 42c and is joined and connected at a tip end thereof to the negative electrode terminal 3. Similarly, one longitudinal end portion of each of the positive electrode collector 41 is extended as an extension portion with no positive electrode active material layers 41b and 41c and is joined and connected at a tip end thereof to the positive electrode terminal 2 although not specifically shown in FIG. 2.

Each of the separators 43 is adapted to prevent a short circuit between the positive and negative electrode plates 41 and 42 while holding the electrolytic solution. For example, the separators 43 are each formed as a fine porous film of polyolefin such as polyethylene (PE) or polypropylene (PP) such that, when an excess current flows, pores of the fine porous film are closed due to heat generation so as to interrupt a flow of current. The separators 43 are not however limited to the single-layer polyolefin film. Alternatively, the separators 43 may have a three-layer structure in which a polypropylene film is sandwiched between polyethylene films or may have a laminated structure in which a polyolefin fine porous film is laminated on an organic nonwoven fabric.

There is no particular limitation on the electrolytic solution. An electrolyte commonly used for a lithium ion secondary battery, such as a non-aqueous electrolytic solution in which a lithium salt is dissolved in an organic solvent, is usable as the electrolytic solution.

As shown by enlargement in FIG. 2, the laminate film of the outer cover member 5 has a three-layer structure of a thermal fusion layer 51, a metal layer 52 and a protection layer 53. The intermediate metal layer 52 is formed of e.g. an aluminum foil. The thermal fusion layer 51 is formed of a thermally fusible synthetic resin such as polypropylene (PP) so as to cover an inner surface of the metal layer 52. The protection layer 53 is formed of a highly durable synthetic resin such as polyethylene terephthalate (PET) so as to cover an outer surface of the metal layer 52. The laminate film may alternatively have a laminated structure of more than three layers. Although the synthetic resin layers are laminated on both of the outer and inner surfaces of the metal layer 52 in the present example, the synthetic resin layer is not necessarily provided on the outer surface of the metal layer 52. The synthetic resin layer may be laminated only on the inner surface of the metal layer 52.

Herein, the ratio of the amount of the electrolytic solution to the sum of the pore volumes of the electrodes 41 and 42 and the separator 43 is preferably in the range of 1.3 to 1.7.

In the present example, the outer cover member 5 is formed by arranging two sheets of the laminate film on lower and upper sides of the battery element 4 as shown in FIG. 2 and thermally fusing four peripheral sides of these two laminate film sheets. Namely, the outer cover member 5 has a two-sheet structure in the present example. The outer cover member 5 may alternatively be formed by folding one relatively large sheet of the laminate film into two, arranging the battery element 4 inside the folded laminate film sheet, and then, thermally fusing three peripheral sides of the folded laminate film sheet.

The pair of the terminals 2 and 3 are located on the short side of the rectangular film covered battery 1 and led out from between mating faces of the laminate film at the time of thermal fusion of the laminate film. Although the pair of the terminals 2 and 3 are arranged in parallel with each other on one side of the film covered battery 1 in the present example, it is alternatively feasible to arrange the positive electrode terminal 2 on one side of the film covered battery 1 and arrange the negative electrode terminal 3 on the other side of the film covered battery 1.

The above film covered battery 1 is manufactured by the following process. First, the battery element 4 is produced by alternately stacking the positive electrode plates 41, the negative electrode plates 42 and the separators 43 and joining the terminals 2 and 3 to the positive and negative electrode collectors by spot welding etc. Next, the battery element 4 is covered by the laminate film sheets of the outer cover member 5. The four peripheral sides of the laminate film sheets (or the three peripheral sides of the two-folded laminate film sheet), except a relatively small filling port, are thermally fused. After the electrolytic solution is filled in the inside of the outer cover member 6 through the filling port, the outer cover member 5 is hermetically sealed by thermally fusing the filling port.

By this, the film covered battery is completed. The film covered battery is subsequently charged to an appropriate level and subjected to aging for a predetermined time. After the completion of the aging, the film covered battery is recharged, tested for battery voltage, and then, shipped.

It is often the case that a plurality of the film covered batteries 1 are accommodated in a flat box-shaped casing and used as a battery module. In such a case, the plurality of the film covered batteries 1 are stacked within the casing of the battery module. There may thus be a situation that the outer cover members 5 are slightly pressurized in a stacking direction of the battery elements 4 (i.e. in a direction perpendicular to main surfaces of the battery elements 4) by e.g. a part of the casing or an elastic member separate from the casing.

According to a first embodiment of the present invention, an insulation failure inspection is performed to inspect whether the aluminum foil metal layer 52 as the intermediate layer of the outer cover member 5 is properly kept insulated from the electrode plate of the battery element 4, in particular, the outermost negative electrode plate 42 in FIG. 2. It is feasible to preform the insulation failure inspection at appropriate timing after the filling of the electrolytic solution and the complete sealing of the outer cover member 5 (the fusing of the filling port) during the above battery manufacturing process. For example, the insulation failure inspection can be performed immediately before the shipment of the film covered battery 1 or immediately after the complete sealing of the outer cover member 5. As there is a case where a foreign matter is deposited inside the battery during the aging step, it is effective to perform the insulation failure inspection immediately after the aging step.

Figure 3:
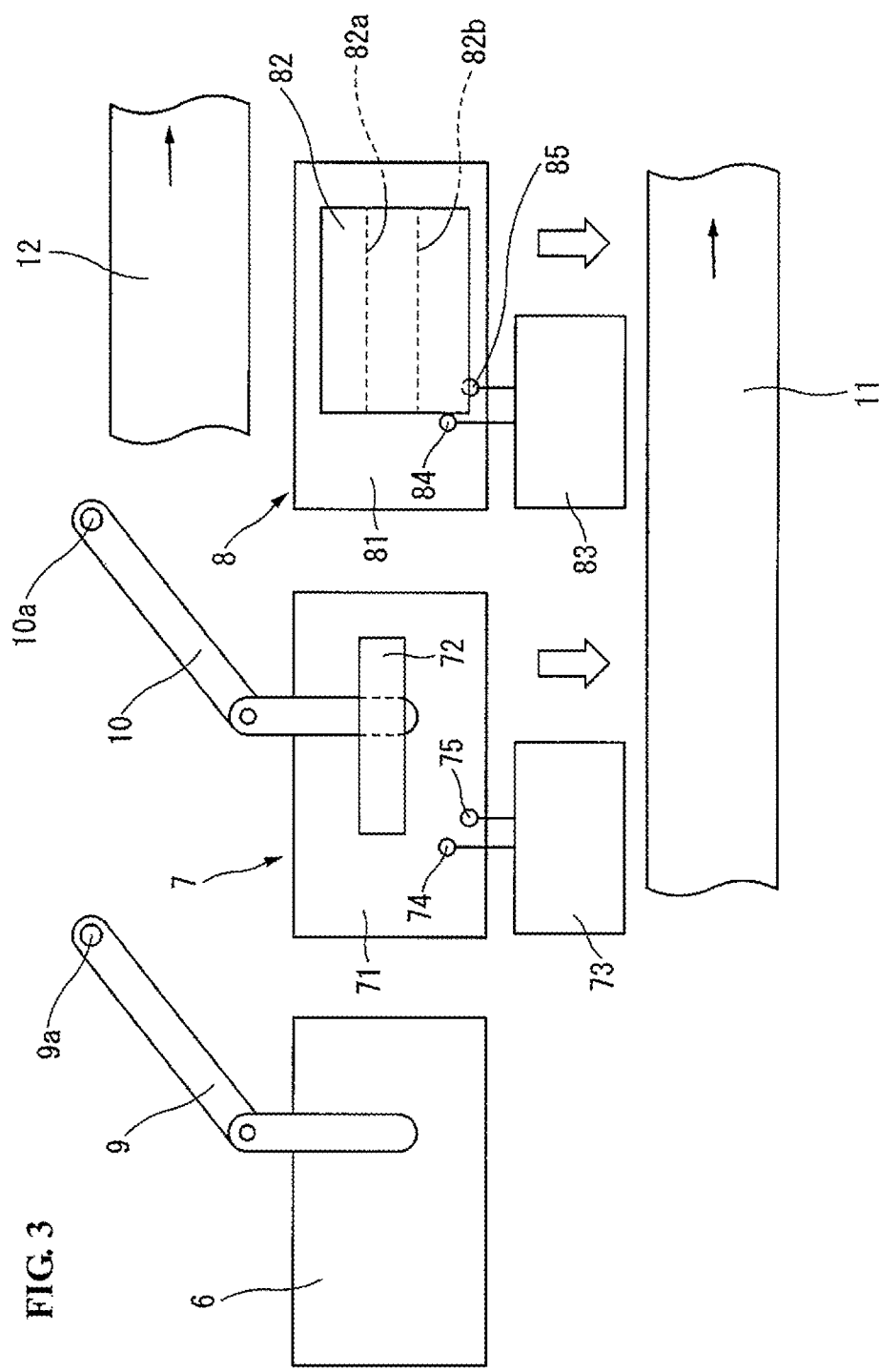
FIG. 3 is a schematic view of an inspection stage unit used in an insulation failure inspection according to a first embodiment of the present invention.

FIG. 3 is a schematic view of an inspection stage unit provided in a manufacturing line of the film covered battery 1 for the insulation failure inspection. The inspection stage unit includes a preparation stage 6 to which the film covered battery 1 is sequentially transferred after the filling of the electrolytic solution and the complete sealing of the outer cover member 5, a first inspection stage 7 on which a first insulation failure inspection test (first-half insulation failure inspection) is performed on the film covered battery 1 and a second inspection stage 8 on which a second insulation failure inspection test (second-half insulation failure inspection) is performed on the film covered battery 1. A first hand 9 is disposed between the preparation stage 6 and the first inspection stage 7 so as to transfer the film covered battery 1 as an inspection target from the preparation stage 6 to the first inspection stage 7. A second hand 10 is disposed between the first inspection stage 7 and the second inspection stage 8 so as to, after the first-half insulation failure inspection of the film covered battery 1 on the first inspection stage 7, transfer the film covered battery 1 from the first inspection stage 7 to the second inspection stage 8. Each of the first and second hands 9 and 10 is in the form of a suction hand having a suction cup (not shown) at a tip end thereof to hold the component part by suction and transfer the film covered battery 1 by swing motion about support parts 9a and 9b.

The first inspection stage 7 has an inspection table 71 on which the film covered battery 1 is placed as the inspection target, a first press bar 72 moved vertically up and down by a cylinder mechanism, a linear servo motor mechanism or the like so as to apply pressure to one part of the outer cover member 5 of the film covered battery 1 and a first inspection device 73 adapted to apply an inspection voltage and analyze a voltage signal after the application of the inspection voltage. The first inspection device 73 is equipped with a pair of probes 74 and 75 for connection to the negative electrode terminal 3 of the film covered battery 1 and the metal layer 52 of the laminate film. The probe 74 for connection to the negative electrode terminal 3 is in the form of for example, an electrode clip capable of holding the negative electrode terminal 3, an electrode pad disposed on the inspection table 71 so as to face any press member by which the negative electrode terminal 3 is pressed from above or an electrode pad by which the negative electrode terminal 3 is pressed against the inspection table 71 from above. The probe 75 for connection to the metal layer 52 of the laminate film is formed into, for example, a sharp needle shape capable of being pierced through the laminate film so as to make conduction with the metal layer 52 by insertion into a thermally fused peripheral margin of the laminate film. The probe 75 may be vertically inserted into the laminate film from above to below or may vertically upwardly protrude from below the inspection table 71. Alternatively, a portion of the metal layer 52 may be exposed at the laminate film and used in place of the needle-shaped probe 75.

The second inspection stage 8 is basically similar in structure to the first inspection stage 7 and has an inspection table 81 on which the film covered battery 1 is placed as the inspection target, a second press bar 82 moved vertically up and down by a cylinder mechanism, a linear servo motor mechanism or the like so as to apply pressure to the other part of the outer cover member 5 of the film covered battery 1 and a second inspection device 83 adapted to apply an inspection voltage and analyze a voltage signal after the application of the inspection voltage. The second inspection device 83 is equipped with a pair of probes 84 and 85 for connection to the negative electrode terminal 3 of the film covered battery 1 and the metal layer 52 of the laminate film. These probes 84 and 85 are similar in configuration to the probes 74 and 75 of the first inspection device 73.

The first inspection stage 7 and the second inspection stage 8 are different in the press surface shapes of the respective press bars 72 and 82.

The first press bar 72 of the first inspection stage 7 has, at a lower end thereof, an elongated rectangular press surface to press a belt-like center region of the rectangular outer cover member 5 in a width direction. The press surface of the first press bar 72 is generally flat and parallel to an upper surface of the inspection table 71.

On the other hand, the second press bar 82 of the second inspection stage 8 has, at a lower end thereof, a pair of two separate elongated rectangular press surfaces to press both side regions of the outer cover member 5 that have not been pressed by the first press bar 72 of the first inspection stage 7. In the drawing, these two separate press surfaces are designated by reference numerals 82a and 82b, respectively. More specifically, the press surfaces 82a and 82b are formed in such a shape that a region corresponding to the press surface of the first press bar 72 is subtracted from a rectangle slightly larger than an area of projection of the battery element 4 on the outer cover member 5 (i.e. an area of the outer cover member 5 covering the battery element 4). The press surface of the first press bar 72 and the press surfaces of the second press bar 82 are thus in a complementary relationship. The sum of the press surfaces of the press bars covers the whole area of projection of the battery element 4 on the outer cover member 5. The press surfaces of the second press bar 82 are also generally flat and parallel to an upper surface of the inspection table 81.

The inspection stage unit further includes a defective product conveyor 11 that transfers the film covered battery judged as a defective product by the first or second inspection stage 7 or 8 and a non-defective product conveyor 12 that transfers the film covered battery judged as a properly-insulated non-defective product by both of the inspection stages 7 and 8. The film covered battery judged as defective by the first or second inspection stage 7 or 8 is ejected from the first or second inspection stage 7 or 8 to the defective product conveyor 11 by an unshown ejection mechanism. The non-defective film covered battery is transferred from the second inspection stage 8 to the non-defective product conveyor 12 by an unshown suction hand.

Figure 4:
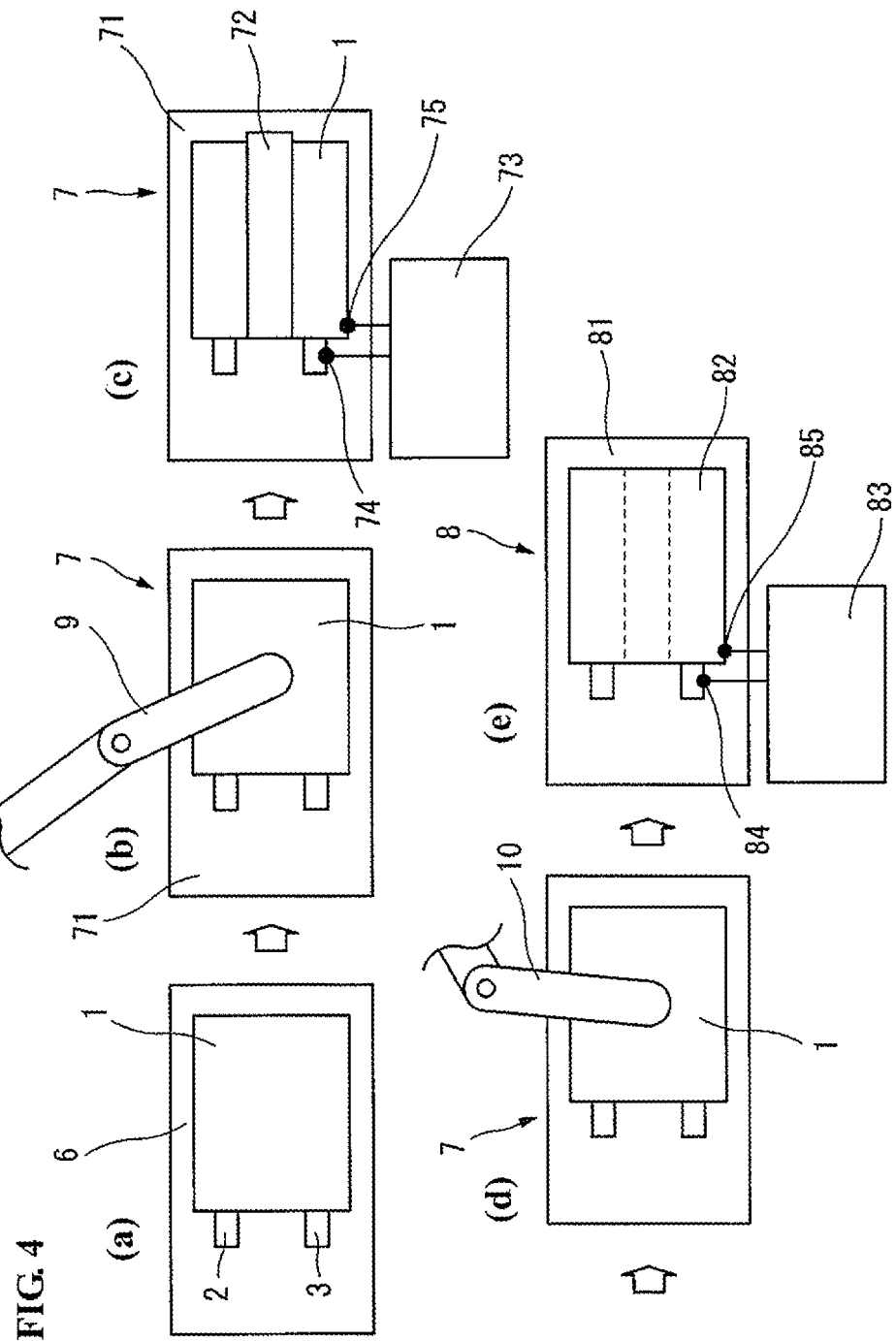
FIG. 4 is a schematic view of the insulation failure inspection according to the first embodiment of the present invention.

FIG. 4 is a schematic view of the procedure of the insulation failure inspection using the above inspection stage unit. In FIG. 4, section (a) shows the state in which the film covered battery 1 is placed as the inspection target on the preparation stage 6. From this state, the first hand 9 lifts up the film covered battery 1 by suction and transfers the film covered battery 1 to the inspection table 71 of the first inspection stage 7 by swing motion as shown in section (b). After the transfer, the first hand 9 is retracted.

Section (c) shows the state of the first insulation failure inspection test of the film covered battery 1 on the inspection table 71. As mentioned above, the probes 74 and 75 of the first inspection device 73 are connected to the negative electrode terminal 3 and the metal layer 52 of the laminate film, respectively. The first press bar 72 moves down and presses the center region of the outer cover member 5 in the width direction. Under such a pressurized condition where the pressure is exerted on one part of the area of projection of the battery element 4, the first inspection device 73 applies the voltage between the probes 74 and 75 for a short time and judges the proper insulation or insulation failure based on the way of voltage drop after the voltage application. When the negative electrode terminal 3 or negative electrode plate 42 and the metal layer 52 are properly kept insulated from each other, there develops a capacitance between the negative electrode plate 42 and the metal layer 52. In the occurrence of an insulation failure, however, there cannot develop a capacitance between the negative electrode plate 42 and the metal layer 52. As the way of voltage drop after the voltage application differs depending on the insulation state, the occurrence or non-occurrence of the insulation failure can be judged based on the way of voltage drop. The insulation failure inspection is not however limited to the above technique. It is feasible to inspect the insulation failure by any of known various techniques. When the film covered battery 1 is inspected under the pressurized condition where the pressure is applied by the first press bar 72 as mentioned above, it is possible to reliably detect such a defective film covered battery 1 that can maintain insulation in a free state but causes insulation failure in a state that the outer cover member 5 is pressed against the battery element 4. In particular, it is possible that the outer cover member 5 can be appropriately pressed against the battery element 4 from both sides, without being interfered with by the electrolytic solution densely filled in the outer cover member 5, by applying the pressure to the part of the main surface of the outer cover member 5 rather than to the whole main surface of the outer cover member 5 at a time.

The film covered battery judged as defective in section (c) is ejected to the defective product conveyor 11. In the other case, the second hand 10 lifts up the film covered battery 1 by suction from the inspection table 71 and transfers the film covered battery 1 to the inspection table 81 of the subsequent second inspection stage 8 by swing motion as shown in section (d). After the transfer, the second hand 10 is retracted.

Section (e) shows the state of the second insulation failure inspection test of the the film covered battery 1 on the inspection table 81. The probes 84 and 85 of the second inspection device 83 are connected to the negative electrode terminal 3 and the metal layer 52 of the laminate film, respectively. The second press bar 82 moves down and presses the side regions of the outer cover member 5 in the width direction. Under such pressurized condition where the pressure is exerted on the other part of the area of projection of the battery element 4, the second inspection device 83 applies the voltage between the probes 84 and 85 for a short time and judges the proper insulation or insulation failure based on the way of voltage drop after the voltage application in the same manner as the first inspection device 73. When the film covered battery 1 is inspected under the pressurized condition where the pressure is applied by the second press bar 82 as mentioned above, it is possible to reliably detect such a defective film covered battery 1 that can maintain insulation in a free state but causes insulation failure in a state that the outer cover member 5 is pressed against the battery element 4. In particular, it is possible that the outer cover member 5 can be appropriately pressed against the battery element 4 from both sides, without being interfered with by the electrolytic solution densely filled in the outer cover member 5, by applying the pressure to the part of the main surface of the outer cover member 5 rather than to the whole main surface of the outer cover member 5 at a time. As the press surface of the first press bar 72 and the press surfaces of the second press bar 82 are in the complementary relationship, the pressure can be applied at least once to every part of the area of the outer cover member 5 covering the battery element 4 in any of the insulation failure inspection tests. It is thus possible to perform the insulation failure inspection all over the battery element without omission.

The film covered battery judged as defective in section (e) is ejected to the defective product conveyor 11. In the other case, the film covered battery is transferred as the non-defective product to the non-defective product conveyor 12.

Figure 5:
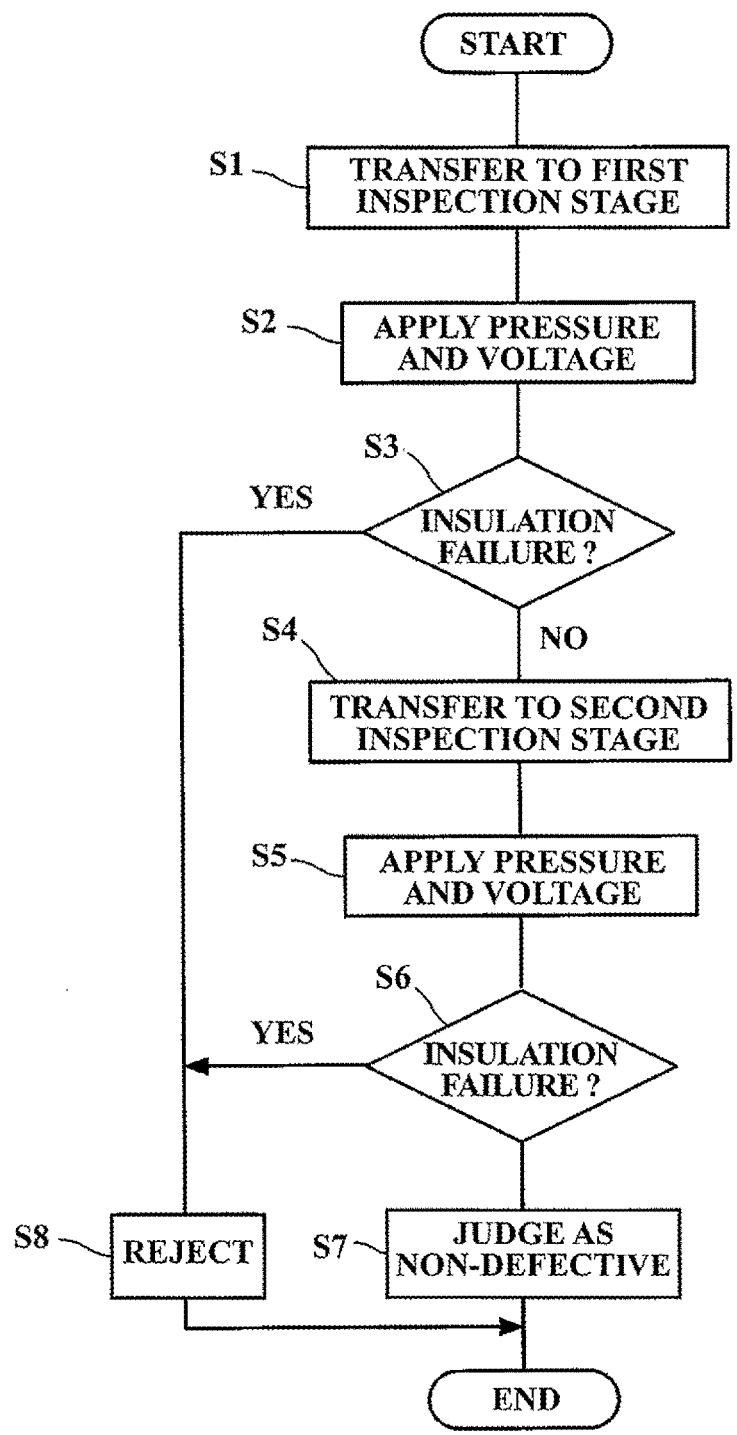
FIG. 5 is a flowchart of the insulation failure inspection according to the first embodiment of the present invention.

FIG. 5 is a flowchart of the insulation failure inspection.

First, the film covered battery 1 is transferred to the first inspection stage 7 at step S1. At step S2, the application of the pressure to the outer cover member 5 and the application of the inspection voltage are carried out. At step S3, the occurrence or non-occurrence of the insulation failure is judged. In the non-occurrence of the insulation failure, the film covered battery 1 is transferred to the second inspection stage 8 at step S4. At step S5, the application of the pressure to the outer cover member 5 and the application of the inspection voltage are carried out. At step S6, the occurrence or non-occurrence of the insulation failure is judged. In the non-occurrence of the insulation failure, the film covered battery 1 is finally judged as the non-defective product at step S7. When the insulation failure is judged as occurring at step S3 or S6, the film covered battery 1 is rejected as the defective product at step S8.

In the above first embodiment, the surface area of the film covered battery 1 to be pressed (i.e. the area of projection of the battery element 4) is divided into three regions in the width direction when viewed in plan in the stacking direction of the battery element 4; the center region is pressed by means of the first inspection stage 7; and the remaining two regions are pressed by means of the second inspection stage 8. Such area division is however arbitrary in the present invention. The surface area of the film covered battery 1 may alternatively be divided into a larger number of regions.

Figure 6:
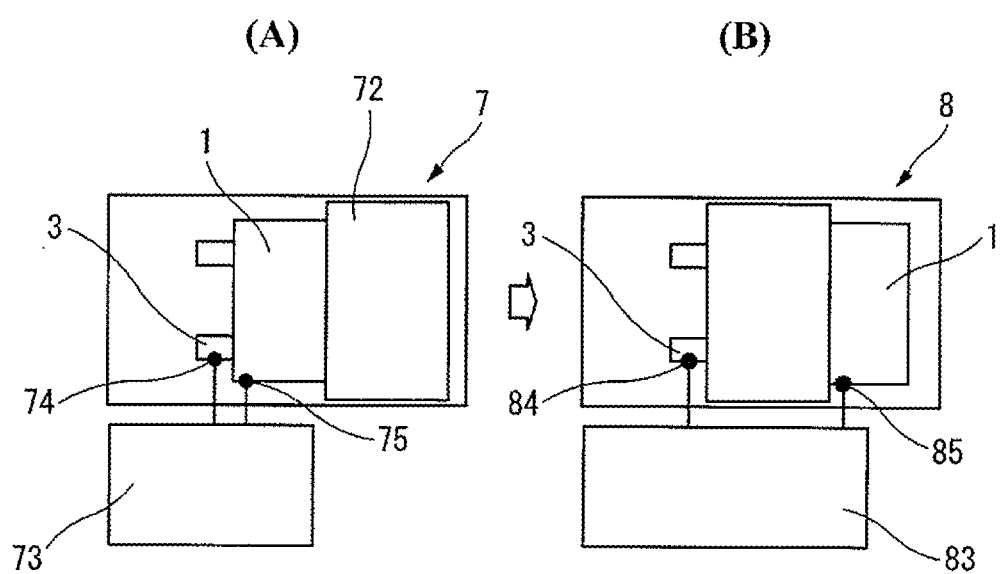
FIG. 6 is a schematic view of an inspection stage unit used in an insulation failure inspection according to a second embodiment of the present invention.

FIG. 6 is a schematic view of an insulation failure inspection according to a second embodiment of the present invention where the surface area of the rectangular film covered battery 1 to be pressed is divided into two regions in a longitudinal direction. In FIG. 6, section (A) shows the state of the first insulation failure inspection test on the first inspection stage 7. The first press bar 72 is disposed vertically movably relative to the inspection table 71. In the second embodiment, the press surface of the first press bar 72 is formed so as to cover substantially a half of the rectangular film covered battery 1 in the longitudinal direction. The insulation failure inspection test is performed by the first inspection device 73 under a pressurized condition where pressure is applied to the half side of the film covered battery 1 opposite from the terminals 2 and 3. Further, section (B) shows the state of the second insulation failure inspection test on the second inspection stage 8. The second press bar 82 is disposed vertically movably relative to the inspection table 81. In the second embodiment, the press surface of the second press bar 82 is formed so as to cover substantially another half of the rectangular film covered battery 1, close to the terminals 2 and 3, in the longitudinal direction. The insulation failure inspection test is performed by the second inspection device 83 under a pressurized condition where pressure is applied to the half side of the film covered battery 1 that has not been pressed by the first inspection stage 7.

Although the present invention has been described with reference to the above specific embodiments, the present invention is not limited to these specific embodiments. Various modifications and variations of the embodiments described above are possible.

In the above embodiments, the first and second insulation failure inspection tests are performed on different inspection tables for efficient inspection of a plurality of the film covered batteries 1. It is alternatively feasible, for reduction of transportation cost, to successively perform the insulation failure inspection tests on one inspection table by applying the pressure to each part of the outer cover member.

Although the insulation failure between the negative electrode terminal 3 and the metal layer of the laminate film is inspected in the above embodiments, it is alternatively feasible to inspect the insulation failure between the positive electrode terminal 2 and the metal layer of the laminate film or inspect both of the insulation failures between the negative electrode terminal 3 and the metal layer of the laminate film and between the positive electrode terminal 2 and the metal layer of the laminate film as needed.

This invention claimed is:

1. An inspection method for a flat film covered battery, the film covered battery being in flat form and comprising:
  a battery element having a plurality of positive and negative electrode plates alternately stacked together via separators, outermost ones of the plurality of positive and negative electrode plates being of the same polarity;
  terminals respectively electrically connected to the positive and negative electrode plates; and an outer cover member formed of a laminate film and sealed to accommodate therein the battery element together with an electrolytic solution with the terminals being led out from the outer cover member, the laminate film having a laminated structure including a protection layer, a metal layer and a synthetic resin layer, the inspection method comprising:

performing an insulation failure inspection to inspect an insulation failure between one of the terminals connected to an outermost one of the plurality of positive and negative electrode plates and the metal layer by bringing a first probe into contact with said one of the terminals and bringing a second probe into contact with the metal layer under a pressurized condition where pressure is externally applied to the outer cover member in a stacking direction of the battery element.

2. The inspection method for the film covered battery according to claim 1, wherein a surface of the outer cover member is divided into a plurality of regions when viewed in plan in the stacking direction; and wherein the insulation failure inspection is performed on each of the divided regions under the pressurized condition where the pressure is applied to said each of the divided regions.

3. The inspection method for the film covered battery according to claim 2, wherein the sum of the divided regions to each of which the pressure is applied includes at least the whole area of the outer cover member covering the battery element.

4. The inspection method for the film covered battery according to claim 1, wherein the insulation failure inspection includes:

transferring the film covered battery to a first inspection stage after filling the electrolytic solution and sealing the outer cover member;

performing a first insulation failure inspection test between the one of the terminals connected to the outermost one of the plurality of positive and negative electrode plates and the metal layer on the first inspection stage while operating a press bar of the first inspection stage to apply the pressure by a press surface of the press bar to one part of an area of the outer cover member covering the battery element;

transferring the film covered battery to a second inspection stage; and performing a second insulation failure inspection test between said one of the terminals and the metal layer on the second inspection stage while operating a press bar of the second inspection stage to apply the pressure by a press surface of the press bar to an other remaining part of the area of the outer cover member covering the battery element.

\* \* \* \* \*